(12) United States Patent
Bell et al.

(10) Patent No.: US 7,844,928 B2
(45) Date of Patent: Nov. 30, 2010

(54) METHOD AND APPARATUS FOR EVALUATING INTEGRATED CIRCUIT DESIGN PERFORMANCE USING ENHANCED BASIC BLOCK VECTORS THAT INCLUDE DATA DEPENDENT INFORMATION

(75) Inventors: Robert H. Bell, Austin, TX (US); Thomas W. Chen, Austin, TX (US); Richard J. Eickemeyer, Rochester, MI (US); Venkat R. Indukuru, Austin, TX (US); Pattabi M. Seshadri, Austin, TX (US); Madhavi G. Valluri, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 11/972,747

(22) Filed: Jan. 11, 2008

(65) Prior Publication Data

US 2009/0183127 A1    Jul. 16, 2009

(51) Int. Cl.
*G06F 17/50* (2006.01)
(52) U.S. Cl. .............................. 716/4; 716/1
(58) Field of Classification Search ............. 716/1, 716/4
See application file for complete search history.

(56) References Cited

U.S. PATENT DOCUMENTS

| | | | |
|---|---|---|---|
| 4,266,270 A | 5/1981 | Daniels et al. | |
| 5,263,153 A | 11/1993 | Intrater | |
| 5,938,760 A | 8/1999 | Levine | |
| 5,961,654 A | 10/1999 | Levine | |
| 6,047,367 A | 4/2000 | Heller | |
| 6,085,338 A | 7/2000 | Levine | |
| 6,189,072 B1 | 2/2001 | Levine | |
| 6,223,171 B1 | 4/2001 | Chadhurl | |
| 6,295,623 B1 * | 9/2001 | Lesmeister et al. | 714/741 |
| 6,466,898 B1 * | 10/2002 | Chan | 703/17 |
| 7,065,624 B1 | 6/2006 | Zahavi | |

(Continued)

OTHER PUBLICATIONS

Robinson—"Initial Starting Point Analysis for K-Means clustering: A Case Study"—Proceedings of ALAR 2006 Conference on Applied Research in Information Technology (Mar. 2006).

(Continued)

*Primary Examiner*—Stacy A Whitmore
*Assistant Examiner*—Magid Y Dimyan
(74) *Attorney, Agent, or Firm*—Matt Talpis; Mark P Kahler

(57) ABSTRACT

A test system or simulator includes an IC benchmark software program that executes application software on a semiconductor die IC design model. The benchmark software includes trace, simulation point, clustering and other programs. IC designers utilize the benchmark software to evaluate the performance characteristics of IC designs with customer user software applications. The benchmark software generates basic block vectors BBVs from instruction traces of application software. The benchmark software analyzes data dependent information that it appends to BBVs to create enhanced BBVs or EBBVs. The benchmark software may graph the EBBV information in a cluster diagram and selects a subset of EBBVs as a representative sample for each program phase. Benchmarking software generates a reduced application software program from the representative EBBV samples. Designers use the test system with benchmarking software to evaluate IC design model modifications by using the representative reduced application software program.

20 Claims, 8 Drawing Sheets

U.S. PATENT DOCUMENTS

| | | | |
|---|---|---|---|
| 2002/0116166 A1* | 8/2002 | El-Ghoroury | 703/14 |
| 2004/0068701 A1* | 4/2004 | Chang et al. | 716/4 |
| 2004/0111708 A1 | 6/2004 | Calder | |
| 2006/0090161 A1 | 4/2006 | Bodas | |
| 2006/0106923 A1 | 5/2006 | Balasubramonian | |
| 2006/0112377 A1 | 5/2006 | Nacul | |
| 2007/0016560 A1 | 1/2007 | Gu | |
| 2007/0157177 A1* | 7/2007 | Bouguet et al. | 717/128 |
| 2008/0307203 A1 | 12/2008 | Bell, Jr. | |
| 2009/0182994 A1* | 7/2009 | Bell, Jr. et al. | 712/227 |
| 2009/0183127 A1* | 7/2009 | Bell et al. | 716/4 |

OTHER PUBLICATIONS

Hamerly—"SimPoint 3.0: Faster and More Flexible Program Analysis"—Dept Computer Science and Engineering UC San Diego (Sep. 2005).

Hamerly—"How to Use SimPoint to Pick Simulation Points"—Dept Computer Science and Engineering UC San Diego (Mar. 2004).

Anderson—"Continuous Profiling: Where Have All the Cycles Gone?"—Digital Equipment Corporation (Oct. 13, 1999).

Eyerman—"A Performance Counter Architecture for Computing Accurate CPI Components"—Proceedings of the 12th International Conference on Architectural Support for Programming Languages and Operating Systems (2006).

Azimi—"Online Performance Analysis by Statistical Sampling of Microprocessor Performance Counters"—Proceedings of the 19th Annual International Conference on Supercomputing (2005).

Taufer—"Scalability and Resource Usage of an OLAP Benchmark on Cluster of PCs"—Proceedings of 14th Annual ACM Symposium on Parallel Algorithms and Architectures (2002).

Puzak—"An Analysis of the Effects of Miss Clustering on the Cost of Cache Miss"—IBM SIGMICRO—(2007).

Annavaram—"The Fuzzy Correlation between Code and Performance Predictability"—Proceedings of the 37th International Symposium on Microarchitecture (2004).

LAU-1—"Transition Phase Classification and Prediction"—11th International Symposium on High Performance Computer Architecture, Feb. 2005.

LAU-2—"The Strong Correlation Between Code Signatures and Performance"—IEEE International Symposium on Performance Analysis of Systems and Software, Mar. 2005.

Laurenzano—"Low Cost Trace-driven Memory Simulation Using SimPoint"—Workshop on Binary Instrumentation and Applications (held in conjunction with PACT2005), St. Louis, MO Sep. 2005.

Pereira—"Dynamic Phase Analysis for Cycle-Close Trace Generation"—International Conference on Hardware/Software Codesign and System Synthesis, Sep. 2005.

Sherwood—"Basic Block Distribution Analysis to Find Periodic Behavior and Simulation Points in Applications" In Proceedings of the International Conference on Parallel Architectures and Compilation Techniques (PACT), Sep. 2001.

Simpoint—"SimPoint Overview"—downloaded from http://www.cse.ucsd.edu/~calder/simpoint/phase_analysis.htm on Oct. 20, 2007.

* cited by examiner

INSTRUCTION SEGMENT OF MUCH LARGER APPLICATION SOFTWARE PROGRAM

400
CONVENTIONAL BASIC BLOCK VECTOR FORMAT
FROM GENERATION METHOD USING BASIC BLOCK
COUNTS FROM APPLICATION SOFTWARE EXECUTING
WITH CONVENTIONAL BENCHMARK SOFTWARE

ENHANCED BASIC BLOCK VECTOR FORMAT GENERATED BY
BENCHMARK SOFTWARE THAT DETERMINES BASIC BLOCK COUNTS
AND RESPECTIVE DATA DEPENDENT INFORMATION WHEN
APPLICATION SOFTWARE EXECUTES ON TEST SYSTEM/SIMULATOR

| ENHANCED BASIC BLOCK VECTOR 1 (EBBV1) | BB1-0 | BB1-1 | BB1-2 | • • • | BB1-47 | DATA DEPENDENT INFORMATION (E.G. CACHE MISS DATA) |
|---|---|---|---|---|---|---|
| | 64 | 17 | 38 | • • • | 29 | 500 |

510-0, 510-1, 510-2, 510, 510-47, 510-CMD

| ENHANCED BASIC BLOCK VECTOR 2 (EBBV2) | BB2-0 | BB2-1 | BB2-2 | • • • | BB2-47 | DATA DEPENDENT INFORMATION (E.G. CACHE MISS DATA) |
|---|---|---|---|---|---|---|
| | 42 | 10 | 70 | • • • | 40 | 350 |

520-0, 520-1, 520-2, 520, 520-47, 520-CMD

| ENHANCED BASIC BLOCK VECTOR N (EBBVN) | BBN-0 | BBN-1 | BBN-2 | • • • | BBN-X | DATA DEPENDENT INFORMATION (E.G. CACHE MISS DATA) |
|---|---|---|---|---|---|---|
| | | | | | | |

530

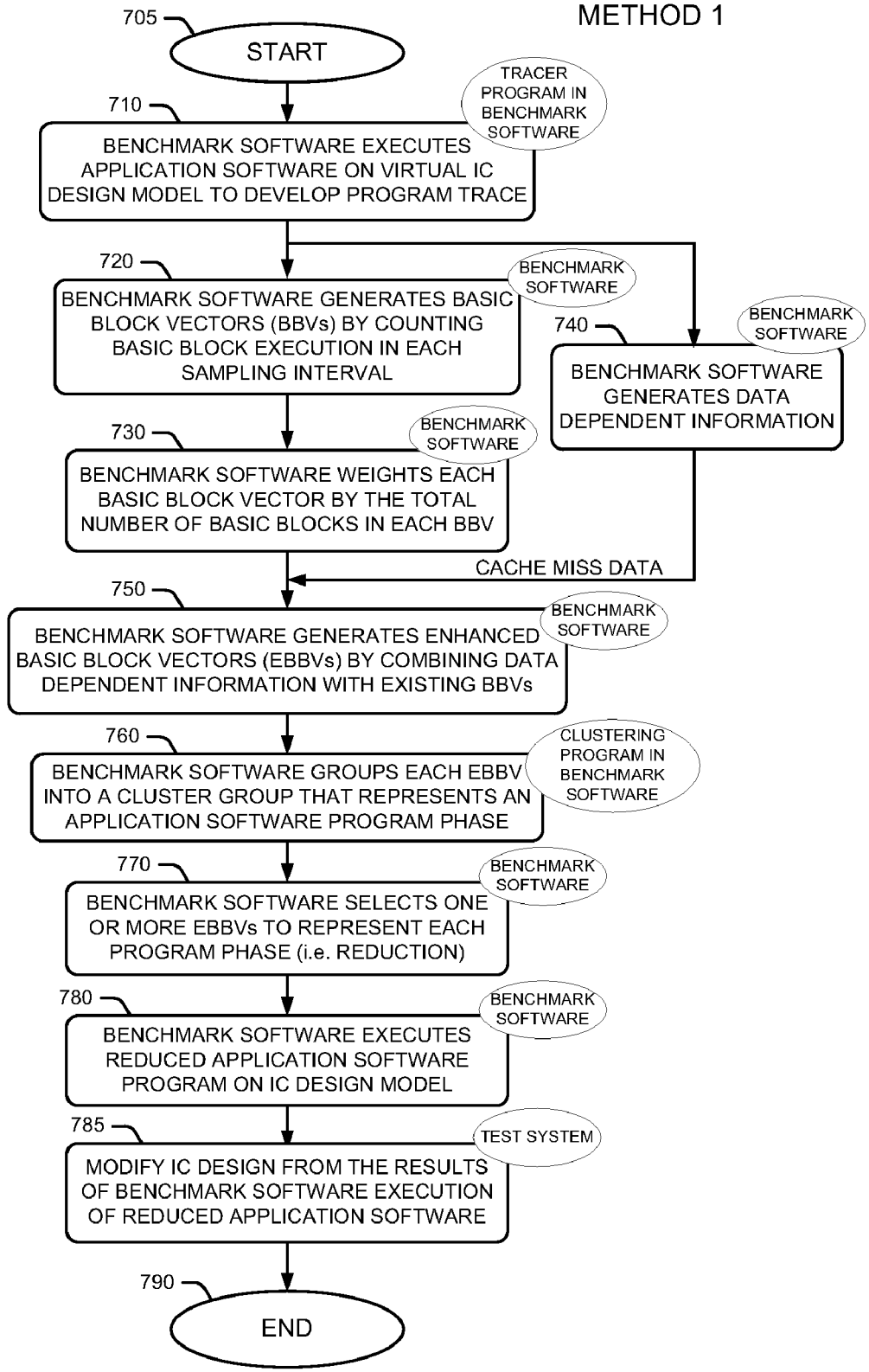

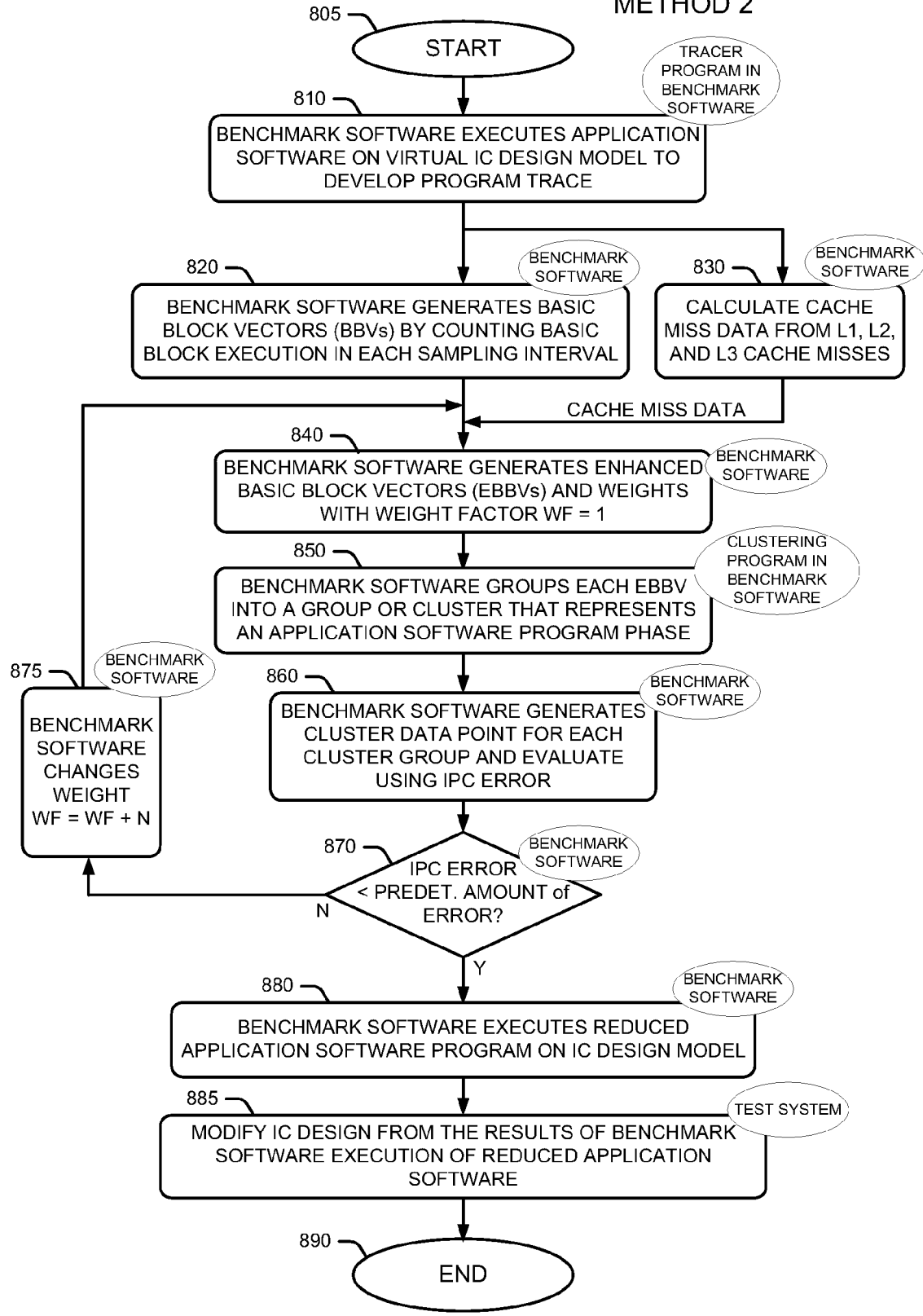
FIG. 8 ENHANCED BASIC BLOCK VECTOR GENERATION AND BENCHMARK METHOD 2

METHOD AND APPARATUS FOR EVALUATING INTEGRATED CIRCUIT DESIGN PERFORMANCE USING ENHANCED BASIC BLOCK VECTORS THAT INCLUDE DATA DEPENDENT INFORMATION

TECHNICAL FIELD OF THE INVENTION

The disclosures herein relate generally to information handling systems (IHSs) that operate as electronic design test systems, and more particularly, to a methodology and apparatus for evaluating performance characteristics of processors and other devices within integrated circuits (ICs) during IC design.

BACKGROUND

An information handling system (IHS) may include a processor for processing, handling, communicating or otherwise manipulating information. Modern IHSs often include integrated circuits (ICs) that incorporate several components integrated together on a common semiconductor die. Some IHSs operates as test systems that evaluate the functionality and performance characteristics of IC designs during the development process of the IC. A typical IC development process employs early design specifications that may include stringent requirements relating to the overall speed, throughput, memory performance of the IC and other requirements. For example, a design requirement of a particular IC may demand that the IC functions without failure at a predetermined clock frequency.

With often stringent requirements on IC design performance, designers try to develop extensive test strategies early in the IC development phase. It is very common to apply these test strategies before the physical IC design hardware is complete. Designers develop computer or IC design models and test various parameters of the device in a test simulation. The more detailed or accurate the IC design model, the more accurate the testing results become. However, more detailed IC models result in longer user application software execution times during testing. Test strategies may involve extensive testing with large user application software in a simulation environment. User application software is the software that the IC design will execute in normal operation. This user application software may include large numbers of instructions that often number in the trillions. Due to the large number of instructions in these applications, it may not be feasible to run or execute a user application software program on an IC design model and still evaluate results in a timely manner. Hours of a typical user application software program execution in a real world processor may correspond to months of execution time within a simulator.

What is needed is a test strategy method and apparatus that addresses the problems faced by integrated circuit IC designers described above.

SUMMARY

Accordingly, in one embodiment, a method of integrated circuit (IC) design model testing is disclosed. The method includes generating, by a simulator or test system, a basic block vector (BBV). The method also includes determining, by the simulator, data dependent information related to the BBV. The method further includes generating, by the simulator, an enhanced basic block vector (EBBV) that includes the BBV and the related data dependent information. The data dependent information may include memory system information and cache miss information. In one embodiment, the simulator weights the EBBV data to affect importance of the data dependent information in the EBBV in comparison with other EBBV data. The simulator may generate a plurality of cluster group of EBBVs and reduce each cluster group to at least one cluster data point to represent the cluster group, thus generating a reduced software application that includes the at least one data point.

In another embodiment, a test system or simulator is disclosed that includes a processor and a memory store that is coupled to the processor. The processor and memory store are configured to generate a basic block vector (BBV). The processor and memory store are configured to determine data dependent information related to the BBV. The processor and memory store are further configured to generate an enhanced basic block vector (EBBV) that includes the BBV and the related data dependent information. The data dependent information may include memory system information and cache miss information. In one embodiment, the processor and memory store are configured to weight the EBBV data to affect importance of the data dependent information in the EBBV in comparison with other EBBV data. The processor and memory store are configured to generate a plurality of cluster group of EBBVs and reduce each cluster group to at least one cluster data point to represent the cluster group, thus generating a reduced software application that includes the at least one data point.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 5 is a block diagram of an enhanced basic block vector format that the disclosed methodology generates.

FIG. 7 is a flow chart that depicts the execution of application software on an IC design model and that employs clustering using EBBV mapping in accordance with one embodiment of the disclosed methodology.

FIG. 8 is a flow chart that depicts an example of performance evaluation of an IC design model with cluster map development and analysis using another embodiment of the disclosed methodology.

DETAILED DESCRIPTION

Figure 1:
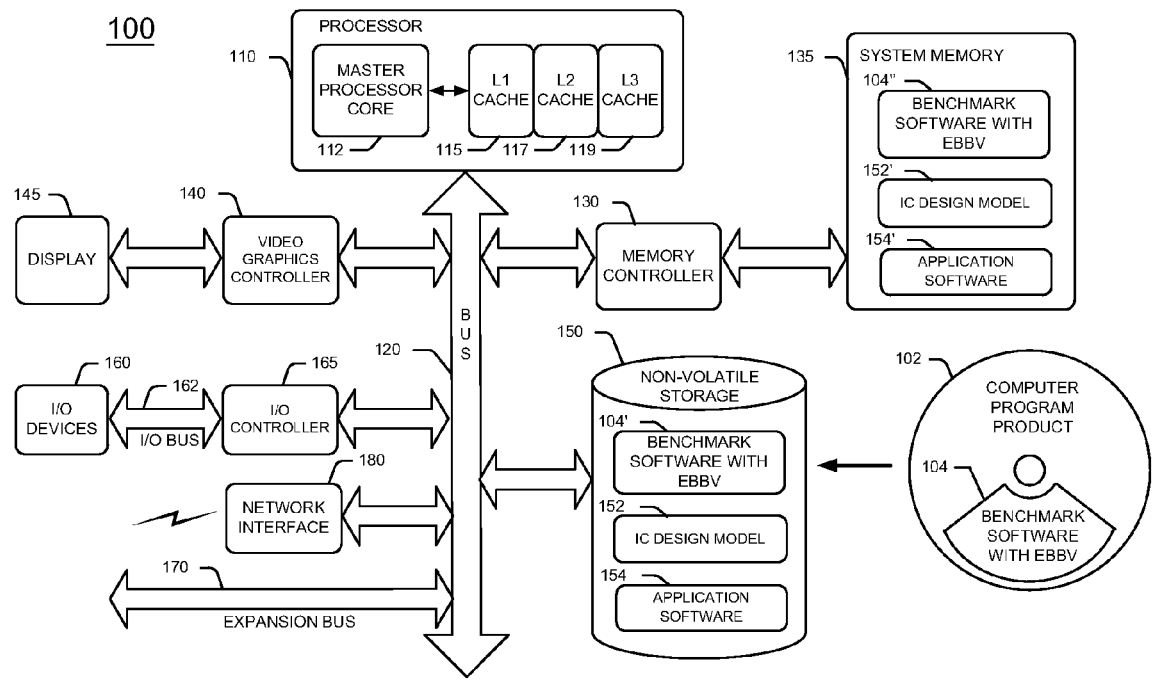
FIG. 1 is a block diagram of an information handling system that employs the disclosed IC design model evaluation methodology.

In any particular integrated circuit (IC), a grouping and interconnection of transistors on the semiconductor die may form a component such as an AND gate, OR gate, flip flop, multiplexer, or other component. Complex IC designs, such as a PowerPC Processor IC, may include billions of transistors or more. (PowerPC is a trademark of the IBM Corporation.) IC development includes the work of IC designers who generate detailed IC transistor and component schematics. IC designers develop software simulation models of a particular IC from these transistor and component schematics. Software simulation models are computer models or IC design models that depict the physical representation of a particular IC design in a virtual mode. By grouping transistors into components and interconnecting the components that form the detailed IC transistor and component schematics, designers develop an accurate IC design model.

An IC design model may include a collection of components with input and output signal characteristics. In other words, each component of the IC design model may include a truth table or other mechanism to predict the output signals of the component that result from particular input signals. A computer simulation may execute or run using the IC design model by providing simulated input signals and predicting resultant output signals. Ultimately, the collection of input signals and resultant output signals provides a detailed signal simulation. Designers may compare the signal simulation against known good signal characteristics of the IC design and determine if the IC design model is performing properly. Designers may also stress an IC design by simulating an increase in clock frequency or providing software applications that extensively test particularly sensitive areas of the IC design.

Computer aided design (CAD) is a broad field that includes tools and methodologies that support the development and analysis of circuits. Computer aided design (CAD) includes IC development. "Simulation Program With Integrated Circuit Emphasis" (SPICE) software a program originating from development work at UC Berkeley, is a common tool of IC designers. IC designers may use SPICE software to simulate analog timing characteristics of the IC design under development. IC designers may use SPICE or other software to test an IC design prior to production to avoid or shorten the costly process of building the IC, testing the IC, and redesigning the IC until achieving acceptable results. In one example, IC integrators use the output of the SPICE software model or a collection of IC timing results as input into the IC benchmark process.

Designers may use the results of a simulation program to benchmark or estimate the performance of the design even prior to fabrication of the design in hardware. Due to the large amount of data associated with software simulation during IC development, software simulation tools typically provide sampling methodologies to reduce the total amount of data for evaluation. Software simulation tools, such as "Simulation Points" (SimPoint), an open source test program promoted at the ASPLOS 2002 and ISCA 2003 conferences, employ one such sampling methodology, namely trace or instruction sampling. Software simulation tools, such as SimPoint, and "Self Monitoring Analysis and Reporting Technology" (SMART) (a Carnegie Mellon University development tool), identify program phase behavior in application software programs using instruction or trace sampling techniques. SimPoint and SMART are examples of tracer programs.

Software simulation tools may collect a grouping of instructions or traces and develop groupings that depict different application software program phases, such as memory reads, memory writes, and numerical processing, for example. Application software may be executed on the IC simulation model or IC design model to reflect real use of the IC. One method of collecting data and graphing the analysis of a simulation of application software execution is to graph the instructions that execute per IC clock cycle. This form of graph is known as an "instruction per cycle" graph or IPC graph. In this manner, it is often possible to identify application software program phases graphically.

FIG. 1 shows one embodiment of the disclosed test system or simulator 100 that an IC designer may employ as an IC design simulation and benchmarking tool. Test system 100 includes a computer program product 102, such as a media disk, media drive or other media storage. Test system 100 includes benchmark software with enhanced basic block vectors (EBBV) 104 that enables IC designers to perform simulation and benchmarking of IC designs. Benchmark software with EBBV 104 may include multiple programs such as trace programs for monitoring information about a particular application software program's execution during simulation. Benchmark software with EBBV 104 includes enhanced basic block vector (EBBV) analysis and generation programs. Benchmark software with EBBV 104 may include instruction and EBBV clustering programs or other programs to support IC design analysis, development and performance modeling. In contrast with other test systems that employ basic block vectors (BBVs), the disclosed test system 100 employs enhanced BBVs (EBBVs) that include data dependent information as explained in more detail below. In test system 100, another term for benchmark software with EBBV 104 is benchmark software with EBBV feature or benchmark software with EBBV.

Test system or simulator 100 includes a processor 110 that includes a master processor core 112. Master processor core 112 couples to an L1 cache 115, an L2 cache 117, and an L3 cache 119. Processor 110 also couples to a bus 120. A memory controller 130 couples a system memory 135 to bus 120. A video graphics controller 140 couples a display 145 to bus 120. Test system 100 includes nonvolatile storage 150, such as a hard disk drive, CD drive, DVD drive, or other nonvolatile storage that couples to bus 120 to provide test system 100 with permanent storage of information. System memory 135 and nonvolatile storage 150 are each a form of data store. I/O devices 160, such as a keyboard and a mouse pointing device, couple via I/O bus 162 and an I/O controller 165 to bus 120.

One or more expansion busses 170, such as USB, IEEE 1394 bus, ATA, SATA, PCI, PCIE and other busses, couple to bus 120 to facilitate the connection of peripherals and devices to test system 100. A network interface 180 couples to bus 120 to enable test system 100 to connect by wire or wirelessly to other network devices. Test system 100 may take many forms. For example, test system 100 may take the form of a desktop, server, portable, laptop, notebook, or other form factor computer or data processing system. Test system 100 may also take other form factors such as a personal digital assistant (PDA), a gaming device, a portable telephone device, a communication device or other devices that include a processor and memory.

Test system or simulator 100 may employ a compact disk (CD), digital versatile disk (DVD), floppy disk, external hard disk or virtually any other digital storage medium as medium 102. Medium 102 stores software including benchmark software with EBBV 104 thereon. A user or other entity installs software such as benchmark software with EBBV 104 on test system 100 prior to conducting testing with the benchmark software with EBBV 104. The designation, benchmark software with EBBV 104', describes benchmark software with EBBV 104 after installation in non-volatile storage 150 of test system 100. The designation, benchmark software with EBBV 104", describes benchmark software with EBBV 104 after test system 100 loads the benchmark software with EBBV 104 into system memory 135 for execution.

An IC design model 152 is a database of timing and other characteristics of a virtual IC design or virtual semiconductor die design for use by benchmark software with EBBV 104. Application software 154 is a program or set of instructions for use by benchmark software with EBBV 104 to simulate the execution of user or other application software on an IC model such as IC design model 152. Benchmark software with EBBV 104 is a software simulation and benchmarking tool. Benchmark software with EBBV 104 may include a software simulation tool program, such as SimPoint or other software simulation program to provide instruction trace analysis in test system 100. Test system 100 executes benchmark software with EBBV 104 to evaluate IC design characteristics of IC design model 152 for performance and other analysis.

IC design model 152 loads on non-volatile storage 150 from another test system or other entity prior to execution of benchmark software with EBBV 104. In a similar fashion, application software 154 loads on non-volatile storage 150 from another test system or other entity prior to execution of benchmark software with EBBV 104. The designation, IC design model 152', describes the IC design model 152 after test system 100 loads the IC design model 152 and benchmark software 104 into system memory 135 for execution. Similarly, the designation, application software 154', describes the application software 154 after test system 100 loads the application software 154 into system memory 135 for execution.

In one embodiment, benchmark software with EBBV 104 implements the disclosed methodology as a set of instructions (program code) in a code module which may, for example, reside in the system memory 135 of test system 100 of FIG. 1. Until test system 100 requires this set of instructions, another memory, for example, non-volatile storage 150 such as a hard disk drive, or a removable memory such as an optical disk or floppy disk, may store this set of instructions. Test system 100 may also download this set of instructions via the Internet or other computer network. Thus, a computer program product may implement the disclosed methodology for use in a computer such as test system 100. In such a software embodiment, RAM or system memory 135 may store code that carries out the functions described in the flowchart of FIG. 7 while processor 110 executes such code. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

Figure 2:
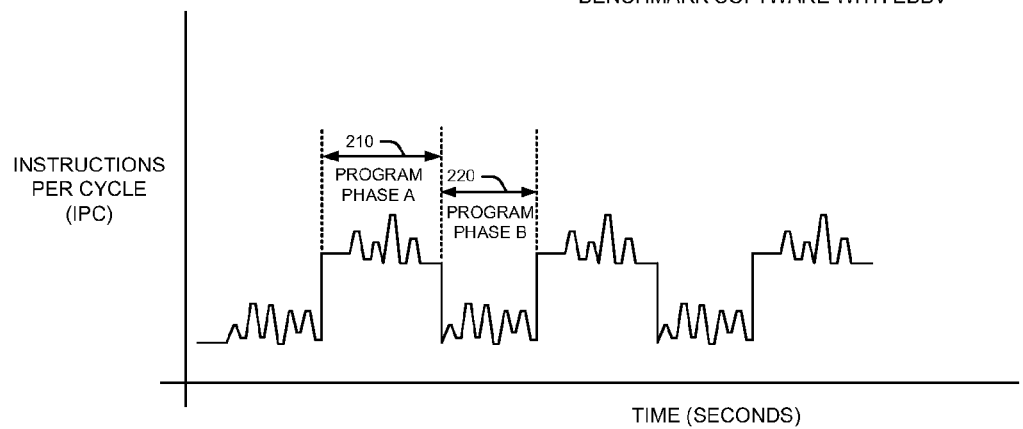
FIG. 2 shows a timing diagram of the disclosed IC design model evaluation methodology that demonstrates an instruction per cycle analysis.

FIG. 2 shows a timing diagram of benchmark software tool analysis of IC design model 152. The timing diagram is a graphical output of the results of a performance and benchmark software tool, namely benchmark software with EBBV 104, that executes the instruction set of application software 154. In this example, timing diagram 200 depicts instructions per cycle (IPC) over a portion of the total execution time of the application software 154. Benchmark software with EBBV 104 traces or collects the count of instructions that complete within the same clock cycle and generates a graphical representation of the results.

Instructions of a typical application software program such as application software 154 may be machine level assembly language instructions such as load, add, move, multiply, or other instructions. In one embodiment, test system 100 may encounter a trillion or more instructions during execution of such an application software program 154. By counting and graphically representing the number of instructions that complete per given clock cycle, patterns such as program phases of a particular application software program may become identifiable for designers and software benchmarking tools.

Program phases of application software 154 that execute within benchmark software with EBBV 104 may include numerical computations, repetitive graphical operations, processor disk load/store operations, register read/write operations or other operations. Each unique program phase has an identifiable physical representation on timing diagram 200 of FIG. 2. For example, a program phase A 210 is one unique portion of timing diagram 200. Program phase A 210 stands out as a group of similarly identifiable "instruction per cycle" (IPC) counts over a period of time or clock cycles. This group of IPC data reflects the instruction completion results of application software 154 executing on IC design model 152. Another program phase, namely a program phase B 220 follows program phase A. Designers and other entities may look for patterns in the IPC timing diagram that may reflect areas of similar program operation. Program phase analysis is an important tool that benchmark software with EBBV 104 may employ to reduce overall application software program review by eliminating or combining similar program phases.

Benchmark software with EBBV 104 may organize the instructions of application software 154 into basic blocks. Organizing the instructions of application software 154 into such basic blacks allows benchmark software with EBBV 104 to reduce the magnitude or total size of the application software instruction data. Basic blocks represent unique instruction segments of the total instruction set of application software 154. Basic blocks are segments or sections of program instructions from a larger application software program, namely application software 154, that start after a branch instruction and end with another branch instruction.

Figure 3:
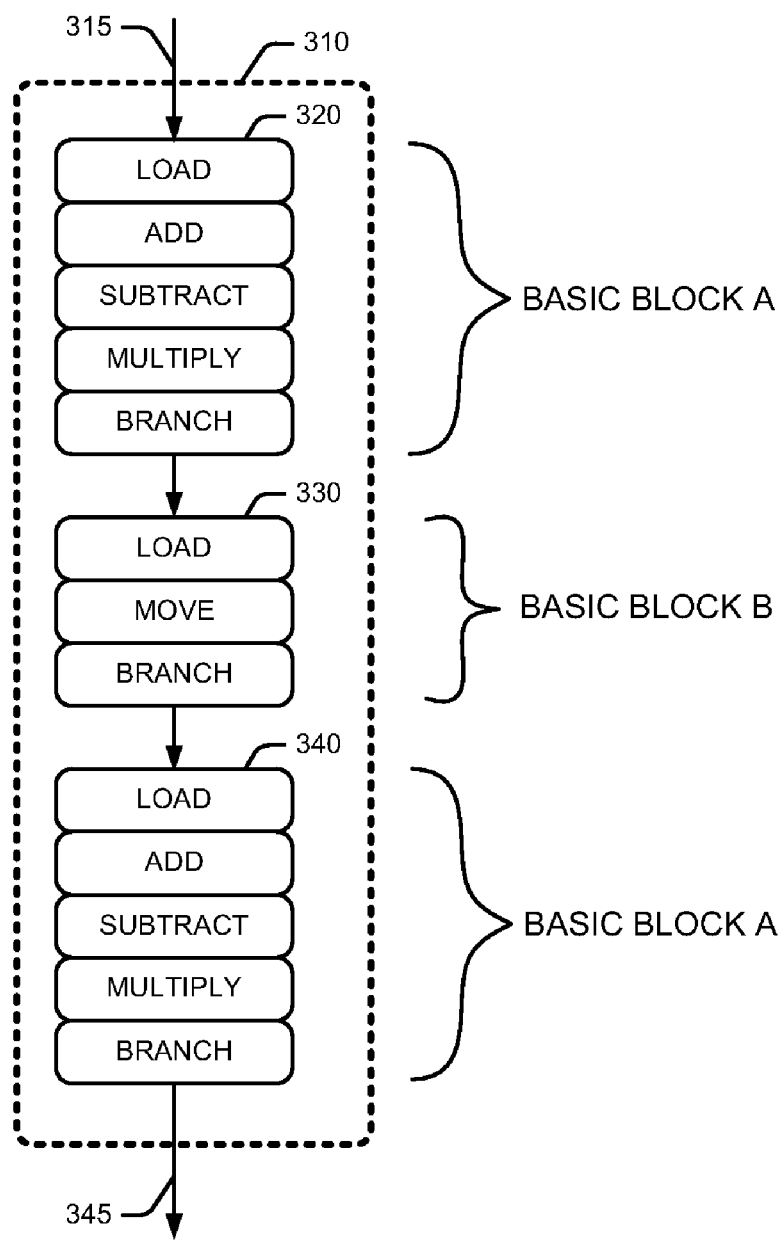
FIG. 3 depicts basic block identification from a particular segment of instructions of a larger application software program.

FIG. 3 is an instruction segment 310 of the much larger set of instructions or lines of code (LOC) of an application software program, such as application software 154. The down arrow 315 at the top of the instruction segment 310 represents a connection from a previous branch instruction of the much larger set of instructions of application software 154. The first instruction at the top of a basic block A 320 is an assembly language or machine language load instruction, namely LOAD. Basic block A 320 includes the LOAD, ADD, SUBTRACT, MULTIPLY and BRANCH instructions at the top of instruction segment 310. As shown in FIG. 3, each basic block is a grouping, collection, or set of individual instructions within a larger instruction sequence. Basic blocks begin after a previous branch instruction. Basic block B 330 of instruction segment 310 follows basic block A 320 of the same instruction segment 310. Basic block B 330 includes the instructions LOAD, MOVE, and ends with a BRANCH instruction.

As with many application software programs, application software 154 includes a large amount of identical basic blocks. In the example of FIG. 3, one such identical basic block is a basic block A 340. Basic block A 340 follows basic block B 330 in the instruction set of instruction segment 310 and includes LOAD, ADD, SUBTRACT, MULTIPLY and BRANCH instructions in sequence. Basic block A 340 is identical to basic block A 320. After basic block A 340, as per the down arrow 345 at the bottom of instruction segment 310, instruction sequencing continues to the larger application software 154 and further instruction segments and basic blocks not shown. Basic block A 320, and basic block A 340 provide an opportunity for benchmark software with EBBV to reduce the total amount of instruction or trace calculations during the software simulation, benchmarking, or other analysis of IC design model 152.

As stated above, application software programs are typically very large, often including more than a trillion individual instructions. Basic blocks, such as the basic blocks of FIG. 3, provide input into one methodology to reduce the total amount of data for software simulation, benchmarking, and performance measuring tools. For example, since basic blocks repeat multiple times within a typical application software program, benchmark software with EBBV 104 may treat basic blocks as the primary unit of measure during execution of application software 154 and further analysis of IC design model 152. In other words, benchmark software with EBBV 104 may collect the execution count or number of times that common basic blocks, such as basic block A, execute during the execution of application software 154 with IC design model 152. A collection of basic block execution counts constitutes one form of a basic block vector (BBV).

One known method for generating BBVs involves executing an application software program in a virtual environment that an IC design model provides. In other words, an IC designer or other entity tests the virtual design of an IC or semiconductor die design that an IC design model represents by executing benchmark software together with application software in a test system with that IC design model loaded. The benchmark software may generate output data to demonstrate the design performance characteristics of the virtual IC design model. Designers may interpret the results of the benchmark software to determine if design guidelines are met, or if redesign efforts in hardware, software, or other design areas are needed.

In one embodiment, benchmark software with enhanced BBV (EBBV) 104 executes application software 154 on a virtual design model, namely IC design model 152, that test system 100 loads. Application software 154 may be special test software for execution of particular areas of IC design model 152. In another embodiment, application software 154 may be user software that end customers plan on using on a real product or production model of IC design model 152. In either case, the benchmark software with EBBV 104 generates real world results corresponding to the instructions that execute therein. In one example, the benchmark software with EBBV 104 evaluates each 10 million instructions during execution of application software program 154 at a time until either the application software program ends, or until the benchmark software with EBBV reaches a particular EBBV count. Each 10 million instructions represent a sampling interval or instruction count size of application software program 154. Another term for sampling interval is instruction interval. An instruction interval is a size in lines of code (LOC) and not a period of time of execution of application software. Thus, the first 10 million LOC form a first instruction interval. Benchmark software with EBBV 104 executes and evaluates the first 10 million instructions of application software 154 and keeps track of each unique basic block that it encounters during execution. In one embodiment, test system 100 is a multi-tasking system. In that case, the first 10 million instructions that benchmark software with EBBV 104 executes may be in a different order than the original lines of code (LOC) of application software 154.

Figure 4:
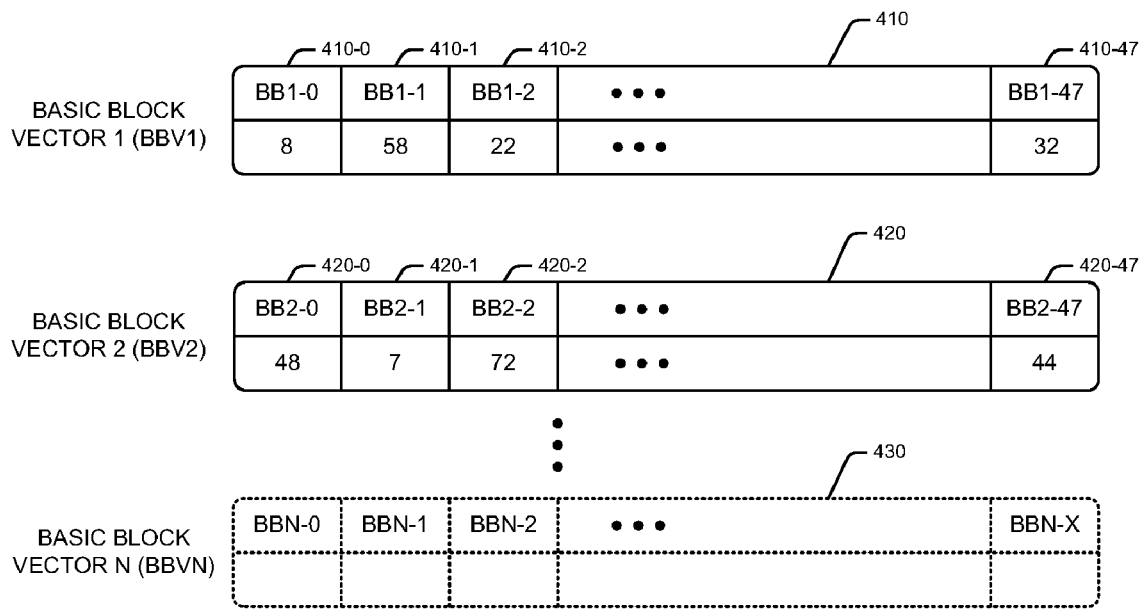
FIG. 4 is a block diagram of multiple basic block vectors that the disclosed IC design model evaluation methodology generates.

FIG. 4 shows one example of a conventional BBV format 400 that conventional benchmark software (not shown) may generate. A basic block vector BBV1 410 includes the results of the first 10 million instructions that execute of a software application executing on an IC design model. Each cell of BBV1 410 in the top row of data includes a respective basic block identifier, namely basic block identifiers for basic block BB1-0 to BB1-47. Below each basic block identifier is the bottom row of data including the respective execution count or number of repetitions of each basic block when the application software executes on a test system or simulator. For example, BBV1 410 includes column 410-0 that describes basic block BB1-0 and its respective execution count of 8. In other words, in this example the first basic block that the conventional benchmark software encounters in the application software is BB1-0, and basic block BB1-0 executes 8 times within the first 10 million execution instructions.

The next unique basic block that the conventional benchmark software encounters in the first 10 million instructions is basic block BB1-1 that executes 58 times during the first 10 million instructions of execution of application software, as shown in column 410-1. Column 410-2 shows basic block BB1-2 with a respective execution count of 22, and so forth until basic block BB1-47 executes 32 times as shown in column 410-47. Basic block vector BBV1 410 is complete or full of data when the conventional benchmark software executes the entirety of the first 10 million instructions of application software. Each entry in the data fields of the bottom row of BBV1 410 represents the number of executions of a respective basic block immediately above. The basic block vector BBV is significantly smaller than the 10 million instructions that conventional benchmark software executes to create the BBV. The BBV offers a dramatic reduction in data for evaluation of application software and hardware performance on a particular IC design model without dramatically reducing the significance or value of that data to the IC design benchmarking process.

Conventional benchmark software executes the next set of 10 million instructions of application software to generate the next basic block vector, namely a BBV2 420. The second 10 million instructions form a second instruction interval. Each cell of BBV2 420 in the top row of data includes a respective basic block identifier, namely basic block identifiers for basic blocks BB2-0 to BB2-47 that form 48 unique basic blocks. Below each basic block identifier is a respective execution count or number of repetitions of the corresponding basic block. These execution counts or repetitions form the bottom row of data of basic block vector BBV2 420. BBV2 420 includes column 420-0 that shows basic block BB2-0 and a respective execution count of 48. In other words, in this example, conventional benchmark software encounters basic block BB2-0 executing 48 times in the second set of 10 million instructions of application software.

The next unique basic block of BBV2 420 that conventional benchmark software encounters is BB2-1 that executes 7 times during the second 10 million instructions of application software execution as shown in column 420-1. Column 420-2 shows basic block BB2-2 and an execution count of 72, and so forth until basic block BB2-47 executes 44 times as seen in column 420-47. Basic block vector BBV2 420 is complete or full of data when the conventional benchmark software executes the entirety of the second 10 million instructions of application software. Each entry in the data fields of the bottom row of basic block vector BBV2 420 represents the execution of a particular basic block per a basic block identifier in the top row. In the case of BBV2 420, the total number of basic blocks remains the same as basic block vector BBV1 410, namely 48 basic blocks in this example. However, basic block execution counts may differ because the BBV format 400 relies on the 10 million fixed number of application software instructions that are unique for each BBV. Any 10 million application software instructions are likely to have a unique set of basic block execution counts.

As the conventional benchmark software generates BBVs, each BBV becomes a unique set of data that is useful for understanding application software flow. In a manner similar to the program phases depicted in IPC timing diagram 200 of FIG. 2, BBVs take on a data form that closely relates to the program phase that the application software executes during their formation. For example, BBV1 410 may represent a memory read/write operation and provides a higher level structure than the detailed instructions that provide the input therein. BBV1 410 includes much less data than the 10 million instructions that conventional benchmark software evaluated during construction of BBV1 410. By grouping similar BBVs, conventional benchmark software may further reduce the total amount of data that designers use to evaluate the performance of a particular IC design model.

Conventional benchmark software continues execution with the next set of 10 million instructions populating a BBV3, BBV4, etc. (not shown), until finally generating a basic block vector BBVN 430, wherein N is the total number of basic block vectors. In other words, BBVN 430 is the last in the series of BBVs that the conventional benchmark software generates during execution of application software 154. BBN-0, BBN-1, BBN-2, and so on including BBN-X, represent the basic blocks that the conventional benchmark software encounters during the final 10 million count of instructions of the application software, namely a last instruction interval. In this example, X is equal to 48 and is the total number of unique basic blocks in BBVN 430. BBVN 430 populates in the same fashion as BBV1 410 and BBV2 420 as described above. BBVN 430 is the final BBV that the conventional benchmark software generates because the application software completes or designers select a maximum BBV count. Typical application software may generate hundreds of BBVs. The BBV count may vary due to the application software program size, sampling interval size (i.e. instruction interval size), BBV format, and other parameters. Although the example of FIG. 4 utilizes a BBV generation size of 10 million instructions (i.e. instruction interval size), and a BBV basic block count of 48, conventional benchmark software, simulation tools, designers, and other entities may select other particular numerical counting methods.

BBVs are a representative sample of the application software that executes on a virtual IC design model. Conventional benchmark software executes a sampling tool program such as SimPoint or other sampling tool that may use the BBV data to establish a frequency and timing of basic block usage. Such conventional benchmark and sampling tool software offers a reduction in overall data for other software tools to use in the aid of IC design development, and provides for much faster IC design analysis than other detailed transistor and component level simulation.

One limitation of conventional benchmark software, such as SimPoint software and BBV generation as shown above in FIG. 4, is that conventional benchmark software captures the "program phase" changes due to changes in program control flow. A program phase represents a particular sequence of basic blocks relating to hardware and software operation. Conventional benchmark software may not capture program phase changes that occur as the result of changes in data dependent events. One such capture weakness is the case wherein data dependencies do not change the control flow directly, but rather the memory behavior of the program. Data dependencies, such as memory behavior, or more particularly cache miss rates, may be lost in the conventional format described above in BBV format 400 of FIG. 4.

FIG. 5 shows an enhanced basic block vector (EBBV) format 500 that includes basic block counts that test system or simulator 100 of FIG. 1 generates when application software 154 executes on the IC design model 152 of test system or simulator 100. EBBV format 500 also includes data dependent information that benchmark software with EBBV 104 generates when application software 154 executes on test system 100. In one embodiment, enhanced basic block vector (EBBV) format 500 reflects the distinct program phases of application software 154 that have similar BBVs but differ in memory behavior. In more detail, in EBBV format 500, benchmark software with EBBV 104 augments each BBV with data dependent information, such as cache miss rate information, for example. In one embodiment, benchmark software with EBBV 104 uses a sampling interval or instruction interval of 10 million instructions to create each EBBV.

An enhanced basic block vector (EBBV), such as EBBV1 510 of FIG. 5, includes some structure in common with conventional basic block vector (BBV) 410 of FIG. 4. However, EBBV 510 also includes additional data dependent information. As seen in FIG. 5, for a first instruction interval of 10 million instructions, EBBV1 includes basic block BB1-0 data of 64 executions in column 510-0. In other words, basic block BB1-0 exhibits an execution count of 64. EBBV2 also includes basic block BB1-1 data of 17 executions in column 510-1. EBBV1 510 further includes BB1-2 data with 38 executions in column 510-2, and so on up to BB1-47 with 29 executions in column 510-47. EBBV1 510 also includes a column 510-CMD that stores data dependent information, for example cache miss data information. In one embodiment, cache miss data column 510-CMD includes a data value of 500 that benchmark software with EBBV 104 generates from miss rate data that L1 cache 115, L2 cache 117, and L3 cache 119 supply.

Cache miss data is an example of data dependent information. Data dependent information may be any information that benchmark software with EBBV 104 collects that indicates an effect from data on the instruction execution of application software, such as application software 154. For example, a cache miss may potentially stall or delay the execution of application software 154 during benchmark software with EBBV 104 execution and analysis. Benchmark software with EBBV 104 may capture or collect information such as clock cycle delays that this potential stall or delay of application software 154 incurs. In one embodiment, the clock cycle delays of a cache miss provide the data dependent information for analysis by benchmark software with EBBV 104.

Benchmark software with EBBV 104 executes the next set of 10 million instructions, i.e. a second instruction interval, of application software 104 to generate the next enhanced basic block vector, namely an EBBV2 520. Each cell of EBBV2 520 in the top row of data includes a respective basic block identifier, namely basic block identifiers for basic blocks BB2-0 to BB2-47. Basic blocks BB2-0 to BB2-47 are 48 unique basic blocks. Below each basic block identifier is a respective execution count or number of repetitions of the corresponding basic block. These execution counts or repetitions form the bottom row of data of basic block vector EBBV2 520. EBBV2 520 includes column 520-0 that shows basic block BB2-0 and a respective execution count of 42. In other words, in this example, benchmark software with EBBV 104 encounters basic block BB2-0 and an execution count of 42 times in the second set of 10 million instructions of application software 154.

The next unique basic block that benchmark software with EBBV 104 encounters is BB2-1 that executes 10 times during the second 10 million instructions of application software execution as shown in column 520-1. Column 520-2 shows basic block BB2-2 and an execution count of 70, and so forth until basic block BB2-47 executes 40 times as seen per column 520-47. Basic block vector EBBV2 520 is complete or full of data when the benchmark software with EBBV 104 executes the entirety of the second 10 million instructions of application software 154. Each entry in the data fields of the bottom row of basic block vector EBBV2 420 represents the execution of a particular basic block.

In the case of EBBV2 520, the total number of basic blocks remains the same as EBBV1 510, namely 48 unique basic blocks. However, the basic block execution counts, as seen in the bottom row of each EBBV, namely EBBV1 510 through EBBVN 530, differ because of the non repetitive nature of application software instructions, such as application software 154. Any 10 million application software instructions are likely to exhibit a unique set of total basic block execution counts. The enhanced BBV format 500 does not rely on a fixed number of basic blocks for any particular EBBV. EBBV2 520 also includes a column 520-CMD that stores data dependent information, for example cache miss data information. In one embodiment, cache miss data column 520-CMD includes a data value of 350 that benchmark software with EBBV 104 generates from miss rate data that L1 cache 115, L2 cache 117, and L3 cache 119 supply.

As the benchmark software with EBBV 104 generates EBBVs, each EBBV becomes a unique set of data that is useful for understanding application software flow. EBBVs take on a data form that closely relates to the program phase that the application software 154 executes during their formation. For example, EBBV1 510 may represent a memory read/write operation and provides a higher level structure than the detailed instructions that provide the input therein. EBBV1 510 includes much less data than the 10 million instructions that benchmark software with EBBV 104 evaluated during construction of EBBV1 510. By grouping similar EBBVs, benchmark software may further reduce the total amount of data that designers use to evaluate the performance of a particular IC design model.

Benchmark software with EBBV 104 continues with next sets of 10 million instructions thus populating an EBBV3, EBBV4, etc. (not shown), until finally generating an enhanced basic block vector EBBVN 530, wherein N is the total number of enhanced basic block vectors. In other words, EBBVN 530 is the last in the series of EBBVs that the benchmark software 104 generates during execution of application software 154. BBN-0, BBN-1, BBN-2, and so on, including BBN-X represent the basic blocks that the benchmark software encounters with each 10 million count of instructions of application software 154. In this embodiment, benchmark software 104, executing the final 10 million instruction count, generates BBN-X wherein X is 48 and the total number of unique basic blocks in EBBVN 530. The basic block count X may vary due to application software program instructions, user input, and other parameters. EBBVN 530 populates in the same manner that EBBV1 510 and EBBV2 520 populate, as described above. EBBVN 530 is the final EBBV that the benchmark software with EBBV 104 generates because the application software completes or designers select a maximum EBBV count. Application software 154 may generate hundreds of EBBVs. The EBBV count may vary due to the application software program size, sampling interval size or instruction interval size, EBBV format, and other parameters. Although the example of FIG. 5 utilizes an EBBV instruction interval size of 10 million instructions, benchmark software, simulation tools, designers, and other entities may select any other particular numerical counting method.

Benchmark software with enhanced basic block vectors (EBBV) 104 executes each 10 million instructions of application software 154 and records cache miss data each time a memory request is made to the cache memory, namely L1 cache 115, L2 cache 117 or L3 cache 119 of processor 110. This cache miss data is an example of data dependent information because it affects the instruction flow of application software 154 due to requests for data. In one embodiment, benchmark software with EBBV 104 executes 10 million instructions of application software 154 and generates a cache miss rate data value in accordance with Equation 1 below.

Cache miss data=[(number of L1 cache misses)*(L1 cache latency)+(number of L2 cache misses)*(L2 cache latency)+(number of L3 cache misses)*(L3 cache latency)]*weighting factor        EQUATION 1

In this example, benchmark software with EBBV 104 generates cache miss data, per Equation 1 for each sampling interval or instruction interval size of 10 million instructions. Sampling intervals greater or less than this interval size are also useable depending on the particular application.

The first term of the cache miss data value of Equation 1 above equals the product of the number of L1 cache 115 misses and the L1 cache 115 latency. The second term of the cache miss data value equals the product of the number of L2 cache 117 misses and the L2 cache 117 latency. The third term of cache miss data of Equation 1 above is equal to the product of the number of L3 cache 119 misses and the L3 cache 119 latency. Benchmark software with EBBV 104 sums each of these three terms of Equation 1 above and multiplies the result by a weighting factor (WF).

Benchmark software with EBBV 104 employs Equation 1 above to generate a cache miss data value for each particular EBBV such as EBBV1. Cache misses are the count or number of times any device makes a memory data request of a cache within processor 110 and receives no data as a result. The cache latency term reflects the delay in number of clock cycles that test system 100 requires to access a particular cache memory. The cache latency term provides a weighting factor (WF) to more accurately reflect the nature or the data value for cache misses as they correspond to basic block counts in the rest of the EBBV. However, this WF does not reflect a proper weighting to the other basic block execution counts as seen in the bottom row of EBBV1 510.

The weighting factor WF term in Equation 1 above provides designers an opportunity to adjust the relative weight and thus importance of the data dependent information as it compares to the total weight of the rest of the EBBV. This weighting term WF adjusts the importance or effect that cache miss data has on the overall EBBV. By adjusting the WF and thus the importance of the cache miss data, the EBBV reflects relative weight of basic block counts and cache miss data. This WF is particularly important when comparing similar EBBVs to each other for potential data reduction during performance evaluation operations. While FIG. 5 shows one EBBV, in actual practice benchmark software with EBBV 104 employs a format 500 that includes multiple such EBBVs.

Figure 6:
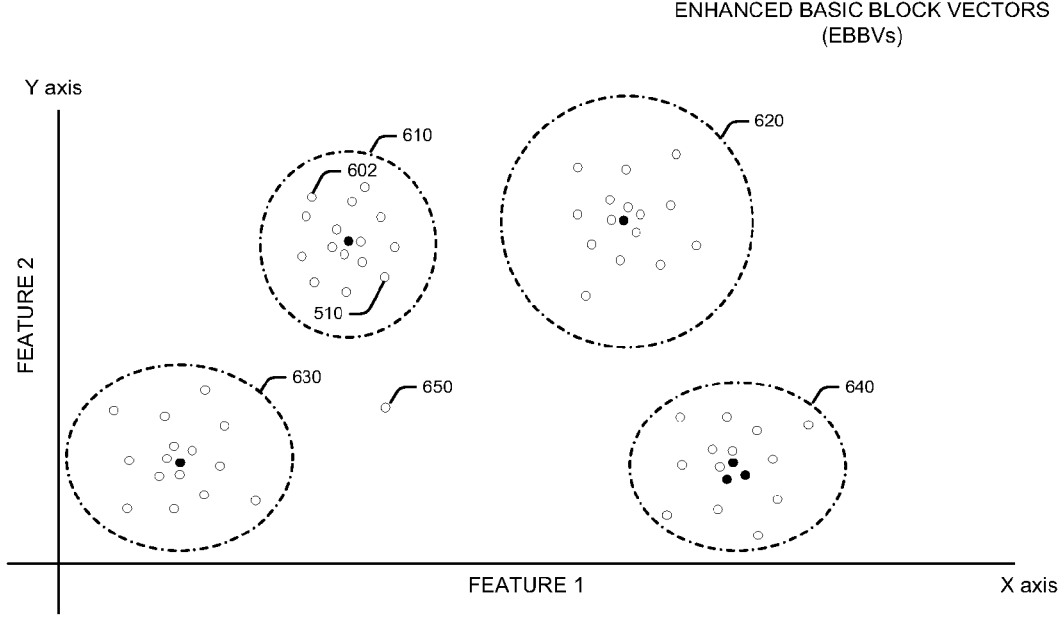
FIG. 6 is a block diagram of a cluster map depicting cluster data points and cluster groups from the mapping of enhanced basic block vectors (EBBVs).

FIG. 6 shows a cluster map diagram 600 that depicts one methodology for grouping enhanced basic block vectors (EBBVs). Each cluster data point, as seen by a small circle such as circle 602 on the cluster map diagram, denotes one EBBV of the collection of EBBVs that benchmark software with EBBV 104 generates during the execution and analysis of application software 154. Each EBBV corresponds to one sampling interval size or instruction interval, such as 10 million instructions, of the basic block analysis of IC design model 152. For example, in FIG. 6 EBBV 510 may represent one unique cluster data point on cluster map diagram 600.

By properly choosing the X axis and Y axis parameters, EBBVs may group or cluster together in relationships that directly link to program phases that occur during the application software 154 execution. In FIG. 6. feature 1 and feature 2 respectively represent the X and Y axis parameters of cluster map diagram 600 that benchmark software with EBBV 104 may generate. The feature 1 and feature 2 parameters provide feature selection or sorting of EBBVs by workload characterization graphing. Workload characterization graphing provides a method of performance modeling by program phase of IC design model 152 while executing application software 154. One such workload characterization method is the K-means clustering analysis method, developed at the University of Berkeley, utilizing Manhattan Distance cluster data point calculations. Manhattan Distance measurement provides for analysis of cluster data points by calculating the sum of the absolute difference of each of their coordinates from one another. Stated alternatively, the distance between two cluster data points is the sum of the orthogonal coordinate distance between the points.

K-means clustering provides a method of grouping or partitioning a large data set into subsets or clusters such that the data in each subset share a common set of traits. K-means clustering may provide this method for grouping the EBBV results of the execution of application software 154 by benchmark software with EBBV 104. For example, a cluster group 610 is a grouping of particular EBBVs that may represent the operational program phase for processing a graphical object transformation on a graphics display, such as display 145. In this example, the common trait is graphical object processing instructions or basic blocks of those particular EBBVs. A cluster group 620 may represent a cluster or group of different particular EBBVs that corresponds to instructions that further execute read and write operations to memory, such as system memory 135. In this example, the common trait is read and write instructions or basic blocks of the different particular EBBVs. A cluster group 630 may represent a grouping of particular EBBVs that have numerical calculations as their common instruction and basic block types. In this example, the common trait is instructions or basic blocks that provide numerical calculations to application software 154. A cluster group 640 may represent any other particular program phase of the execution of application software 154.

During performance evaluation, benchmark software with EBBV 104 may ignore some EBBVs, such as EBBV 650, that fall clearly outside of the major cluster groups 610, 620, 630 and 640. EBBV 650 may represent a one time operation or single event group of basic blocks that does not repeat during the execution of application software 154. The cluster program phase map diagram 600 of EBBVs presents unique opportunities to reduce the overall benchmarking complexity by reducing the amount of data that benchmark software with EBBV 104 analyzes after execution of application software 154.

For example, in one embodiment, benchmark software with EBBV 104 may reduce each cluster that corresponds to a program phase to a single representative EBBV. One method to reduce the overall complexity or size of the application software program is to have the benchmark software with EBBV 104 calculate the centroid or center of each cluster and choose the EBBV that is closest to the centroid or center. The dark circle, or cluster data point nearest the centroid or center of cluster group 610 is the EBBV that most closely fits the parameters nearest to the cluster centroid.

Another technique that benchmark software with EBBV 104 may use to reduce each cluster group in size is to choose an EBBV count and select that count or number of EBBVs nearest the centroid of a cluster. For example, in one embodiment, benchmark software with EBBV 104 chooses an EBBV count of 3, and the three dark points at the center of cluster group 640 are EBBVs that benchmark software with EBBV 104 selects as representative EBBVs. To weight each cluster properly, benchmark software with EBBV 104 may include 3 copies of the EBBV at the center of cluster groups 610, 620, 630 and the 3 EBBVs of cluster group 640. In this manner, benchmark software with EBBV 104 more properly weights each cluster group of cluster map diagram 600 equally. Many other weighting schemes are possible as well. Designers select these methodologies by determining the best trade-off between simulation time, raw data for input, number crunching capability of the test system, and other factors.

FIG. 7 is a flowchart that depicts the steps of an enhanced basic block vector EBBV generation method 1 that includes application software analysis by program tools in benchmarking software, such as benchmark software with EBBV 104. The EBBV generation method 1 begins at start block 705. Benchmark software with EBBV 104 executes a tracer program on application software 154 within the test system 100 simulation that includes IC design model 152 as a virtual hardware model, as per block 710. Benchmark software with EBBV 104 executes a tracer program to generate an instruction trace including basic block structure information.

Tracer programs provide information that identifies the instruction address of the first instruction of each basic block and the number of instructions in each basic block. Examples of tracer programs include, but are not limited to, the "C Library Trace Program" (CTrace), the "Maryland Applications for Measurement and Benchmarking of I/O On Parallel Computers" tracer program (Mambo), and the AriaPoint tracer program by Aria Technologies. Tracer programs may provide count information that specifies how many times the application software 154 executes each basic block. In other words, tracer programs within benchmark software with EBBV 104 provide analysis of application software 154, wherein that analysis provides input for the generation of BBVs.

During execution of application software 154, benchmark software with EBBV 104 generates BBVs by counting basic blocks in an instruction sampling interval of 10 million instructions or other instruction sampling interval, as per block 720. Instruction sampling intervals of 1000 instructions, 100 million instructions and other sizes are potential alternatives. Sampling interval size selection reflects the designer's desired performance resolution or detail, as well as the total allowable benchmarking time available.

Benchmark software with EBBV 104 weights each BBV that it generates to provide for an equal level of comparison between any BBVs. In one embodiment, benchmark software with EBBV 104 weights each BBV by a weighting factor that is the total number of basic blocks within each BBV, as per block 730. Benchmark software with EBBV 104 uses this weighting factor to modify each BBV respectively. Benchmark software with EBBV 104 generates data dependent information such as cache miss rates, as per Equation 1 above. During the execution of application software 154, benchmark software with EBBV 104 generates data dependent information, as per block 740. In one embodiment, benchmark software with EBBV 104 generates data dependent information dynamically, or during application software execution. This dynamically generated data dependent information is "flybydata" because benchmark software with EBBV 104 collects the information on-the-fly during application software 154 execution.

Benchmark software with EBBV 104 of the disclosed test system 100 may collect data dependent information from hardware performance counters of IC design model 152. Processors, such as processor 110, support events that benchmark software with EBBV 104 may monitor during execution of application software 154. Basic blocks capture many of these events and become part of the overall data that benchmarking software with EBBV 104 analyzes. However, some events that relate to the memory subsystems, such as system memory 135 and the cache memory of processor 110 may not reflect in the basic block vectors. For example, BBVs may not reflect data dependent events such as cache misses in the memory subsystem of test system or simulator 100.

The number of cache misses is typically much lower than the number of basic blocks that benchmark software with EBBV 104 counts during a given instruction sampling interval. In one embodiment of the disclosed test system and test methodology, benchmark software with EBBV 104 will weight the data dependent information appropriately before appending it to the BBV. If the data dependent information is not properly weighted, the impact of the cache misses may be lost during clustering. Benchmark software with EBBV 104 uses the results of Equation 1 above to arrive at a useful data cache miss rate value to append to a basic block vector (BBV) to form an enhanced basic block vector (EBBV). Designers may adjust the weight factor WF values to account for differing instruction mixes and other application software dependencies. Benchmark software with EBBV 104 combines the data dependent information per BBV to generate a new EBBV, as per block 750.

Benchmark software with EBBV 104 includes a clustering program, such as a K-means clustering analysis program, to group each EBBV into one or more cluster groups, as per block 760. Each cluster group, as seen in the example of FIG. 6, corresponds to a respective program phase. In one embodiment, benchmark software with EBBV 104, while performing a K-means clustering analysis, uses a Manhattan Distance cluster data point measurement and centroid calculation method to perform this clustering.

In one embodiment, benchmark software 104 reduces each cluster to one or a minimum grouping of EBBVs to represent the entire cluster or program phase. Benchmark software with EBBV 104 selects a particular EBBV or EBBVs as the representative instruction interval for each program phase, as per block 770. Benchmark software 104 may select the particular EBBV(s) that are nearest the cluster centroid as a representative EBBV reduction for that cluster. The representative EBBV reduction corresponds to an instruction sampling interval of the application software 154 of 10 million instructions per EBBV. Benchmark software with EBBV 104 collects the EBBV reduction intervals from all clusters to create reduced application software (not shown). Benchmark software with EBBV 104 executes the reduced application software on IC design model 105 to develop benchmarking and performance analysis, as per block 780.

The reduced application software is representative of the larger application software 154. In other words, while benchmark software with EBBV 104 executes the reduced application software, the IC design model 105 responds in close approximation to application software 154. The closer the reduced application software executes on IC design model 105 to application software 154, the more efficient and effective the benchmarking process becomes. Designers and other entities using test system 100 may modify the IC design model 105 from the results of benchmark software with EBBV 104 results, as per block 785. The EBBV generation method 1 ends, as per end block 790.

FIG. 8 is a flowchart that depicts another example of an EBBV generation methodology and benchmark analysis. The EBBV generation method 2 of FIG. 8 begins at start block 805. Benchmark software with EBBV 104 executes a tracer program on application software 154 that employs IC design model 152 as a virtual hardware model, as per block 810. Benchmark software with EBBV 104 executes the tracer program, such as the CTrace tracer program, the Mambo tracer program, the AriaPoint tracer program, or other tracer program to provide information that identifies the address of the first instruction of each basic block and the number of instructions in each basic block. The tracer program benchmark software with EBBV 104 may also provide count information that notes how many times the application software 154 executes each basic block. In other words, the tracer program within benchmark software with EBBV 104 provides analysis of application software 154 to supply input for the generation of BBVs.

During execution of application software 154, benchmark software with EBBV 104 generates BBVs by counting basic blocks in a sampling interval, for example 10 million or other instruction sampling interval, per block 820. Benchmark software with EBBV 104 monitors and accumulates L1 cache 115, L2 cache 117, and L3 cache 119 miss rates to calculate the cache miss data for EBBV generation, as per block 830. This cache miss data is data dependent information. In this embodiment, benchmark software with EBBV 104 applies various weighting factors (WFs) for modifying the cache miss data. Initially, benchmark software with EBBV 104 applies a WF of 1 by using Equation 1 above to the cache miss data, and appends the cache miss data with weight to each BBV to generate the respective EBBVs, as per block 840. EBBV1 510 depicts one example wherein benchmark software with EBBV 104 modifies a BBV format with data dependent information to form EBBV format 500. EBBV format 500 further demonstrates one such example of appending cache miss data with weighting factor WF to a BBV to generate an EBBV, namely EBBV1 510 with a cache miss data column 510-CMD value of "500".

Benchmark software with EBBV 104 executes a clustering program, such as a K-means clustering analysis, to group each EBBV into one or more cluster groups, as per block 850. The cluster groups, as seen in the example of FIG. 6, each correspond to program phases. In one embodiment, benchmark software with EBBV 104 performs a K-means clustering analysis and employs a Manhattan Distance cluster data point measurement and centroid calculation technique. Clustering analysis groups EBBVs into program phases corresponding to unique operational phases of application software execution.

Benchmark software with EBBV 104 reduces each cluster to one or a minimum grouping of EBBVs to represent the entire cluster or program phase. Benchmark software with EBBV 104 chooses a particular EBBV as the representative cluster data point for each program phase. Benchmark software with EBBV 104 evaluates the cluster data point using an "instruction per cycle" (IPC) error method to determine how representative the cluster data point is to the entire cluster, as per block 860. An IPC error method involves comparing the IPC of the cluster data point to the IPC of a full instruction trace sample of the same EBBV instruction segment. The smaller the error, the closer the cluster sample is to ideal conditions, namely, the cluster data point represents the entire cluster.

Benchmark software with EBBV 104 evaluates the IPC error to determine if the IPC error is less than a predetermined amount of error, as per decision block 870. Designers may use predetermined amount of IPC errors of 1% or less in initial evaluations. Designers may modify the IPC errors to a smaller or larger value depending upon how long the analysis takes, how close the benchmarking process is to ideal conditions, or other factors. If the error is not less than the predetermined amount of error, then benchmark software with EBBV 104 modifies the WF value by an incremental increase of N, as per block 875. Benchmark software with EBBV 104, a user, or other entity may define the value of N as 1, 2, 5, 10, or any other value. Benchmark software with EBBV 104 generates EBBVs and flow continues again, as per block 840. However, if the IPC error is less than the predetermined amount of error, then benchmark software with EBBV 104 collects the EBBV reduction intervals from all clusters to create reduced application software (not shown). Benchmark software with EBBV 104 executes the reduced application software on IC design model 105 to develop benchmarking and performance analysis, as per block 880.

The reduced application software is representative of the larger application software 154. In other words, while benchmark software with EBBV 104 executes the reduced application software, the IC design model 105 responds in close approximation to that of application software 154. The closer the reduced application software executes on IC design model 105 to application software 154, the more efficient and effective the benchmarking process becomes. Designers and other entities using test system 100 may modify the IC design model 105 from the results of benchmark software with EBBV 104 results, as per block 885. The EBBV generation method 2 ends, as per end block 890.

The foregoing discloses methodologies wherein an IC design system employs benchmark software to provide IC design personnel with IC design system tools for simulation, design benchmarking, and other analysis. In one embodiment, benchmarking software initiates multiple programs such as instruction trace, simulation point sampling, enhanced basic block generation, K-means clustering analysis, and other programs. Designers may use the benchmark software tools to perform IC design model performance analysis.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of IC design model testing, comprising:
    generating, by a simulator information handling system (IHS), a basic block vector (BBV);
    determining, by the simulator IHS, data dependent information related to the BBV, thus providing related data dependent information; and
    generating, by the simulator IHS, an enhanced basic block vector (EBBV) that includes the BBV and the related data dependent information.

2. The method of claim 1, wherein the data dependent information is one of memory system information and cache miss information.

3. The method of claim 1, wherein the simulator IHS includes benchmark software that executes on a test system that includes the IC design model.

4. The method of claim 1, further comprising weighting, by the simulator IHS, the EBBV to affect importance of the data dependent information in the EBBV.

5. The method of claim 4, further comprising generating, by the simulator IHS, a cluster group of EBBVs.

6. The method of claim 5, further comprising reducing, by the simulator IHS, each cluster group to at least one cluster data point to represent the cluster group, thus generating a reduced software application that includes the at least one data point.

7. The method of claim 6, further comprising executing, by the simulator IHS, the reduced software application to provide test information.

8. The method of claim 7 further comprising altering the IC design in response to the test information.

9. A test system comprising:
    a processor;
    a memory store, coupled to the processor, configured to:
        generate a basic block vector (BBV);
        determine data dependent information related to the BBV, thus providing related data dependent information; and
        generate an enhanced basic block vector (EBBV) that includes the BBV and the related data dependent information.

10. The test system of claim 9, wherein the memory store comprises one of a system memory and a non-volatile storage.

11. The test system of claim 9, wherein the data dependent information is one of memory system information and cache miss information.

12. The test system of claim 9, wherein the memory store is further configured to weight the EBBV to affect importance of the data dependent information in the EBBV.

13. The test system of claim 12, wherein the memory store is further configured to generate a cluster group of EBBVs.

14. A test system comprising:
    a processor;
    a memory store, coupled to the processor, configured to:
        generate a basic block vector (BBV);
        determine data dependent information related to the BBV, thus providing related data dependent information;
        generate an enhanced basic block vector (EBBV) that includes the BBV and the related data dependent information;
        weight the EBBV to affect importance of the data dependent information in the EBBV;
        generate a cluster group of EBBVs; and
        reduce each cluster group to at least one cluster data point to represent the cluster group, thus generating a reduced software application that includes the at least one data point.

15. The test system of claim 14, wherein the memory store is further configured to execute the reduced software application to provide test information.

16. A computer program product stored on a non-transitory computer storage medium, comprising:
    instructions that generate a basic block vector (BBV);
    instructions that determine data dependent information related to the BBV, thus providing related data dependent information; and
    instructions that generate an enhanced basic block vector (EBBV) that includes the BBV and the related data dependent information.

17. The computer program product of claim 16, wherein the data dependent information is one of memory system information and cache miss information.

18. The computer program product of claim 16, further comprising instructions for weighting the EBBV to affect importance of the data dependent information in the EBBV.

19. The computer program product of claim 18, further comprising instructions for generating a cluster group of EBBVs.

20. The computer program product of claim 19, further comprising instructions for reducing each cluster group to at least one cluster data point to represent the cluster group, thus generating a reduced software application that includes the at least one data point.

* * * * *